(12) United States Patent
Itasaka

(10) Patent No.: US 10,284,206 B2
(45) Date of Patent: May 7, 2019

(54) OSCILLATOR, ELECTRONIC DEVICE, AND MOVING OBJECT

(71) Applicant: Seiko Epson Corporation, Tokyo (JP)

(72) Inventor: Yosuke Itasaka, Tatsuno-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 194 days.

(21) Appl. No.: 15/378,358

(22) Filed: Dec. 14, 2016

(65) Prior Publication Data

US 2017/0179961 A1 Jun. 22, 2017

(30) Foreign Application Priority Data

Dec. 21, 2015 (JP) ................................ 2015-248274

(51) Int. Cl.
| | |
|---|---|
| *H03B 5/24* | (2006.01) |
| *H03B 5/32* | (2006.01) |
| *H03B 5/36* | (2006.01) |
| *H03L 1/02* | (2006.01) |
| *H03L 1/04* | (2006.01) |

(52) U.S. Cl.
CPC ................ *H03L 1/04* (2013.01); *H03B 5/24* (2013.01); *H03B 5/32* (2013.01); *H03B 5/362* (2013.01); *H03B 5/368* (2013.01); *H03L 1/028* (2013.01); *H03B 2200/0038* (2013.01); *H03B 2201/0208* (2013.01)

(58) Field of Classification Search
CPC .......... H03K 3/011; H03B 5/366; H03B 5/36; H03B 2201/0208; H03B 5/32; H03B 5/24; H03L 1/04

USPC .................................. 331/158, 176, 116 FE
See application file for complete search history.

(56) References Cited

U.S. PATENT DOCUMENTS

| | | | | |
|---|---|---|---|---|
| 5,446,420 | A * | 8/1995 | Westwick .......... | G01R 31/2824 331/175 |
| 5,982,241 | A * | 11/1999 | Nguyen .................... | H03B 5/36 331/1 R |
| 2009/0302954 | A1* | 12/2009 | Chen ...................... | H03K 3/011 331/66 |
| 2010/0188156 | A1* | 7/2010 | Arai ....................... | H03B 5/366 311/15 |

(Continued)

FOREIGN PATENT DOCUMENTS

JP 4985035 B2 5/2012

*Primary Examiner* — Arnold M Kinkead
(74) *Attorney, Agent, or Firm* — Oliff PLC

(57) ABSTRACT

An oscillator includes: an oscillation stage circuit that is connected between a first electrode and a second electrode of a resonator and performs an oscillation operation; a variable capacitance element that is connected to the first or second electrode of the resonator and adjusts an oscillation frequency; a bandgap reference circuit that generates a reference voltage having magnitude, which changes depending on the temperature, by using a resistor inserted in a current path through which a current having magnitude, which changes depending on the temperature flows; and a bias current generating circuit that generates a bias current of the oscillation stage circuit based on the reference voltage, and that, thereby, reduces a change in the oscillation frequency due to the temperature dependence of the impedance of the resonator or the temperature dependence of the sensitivity of the variable capacitance element.

10 Claims, 9 Drawing Sheets

(56) References Cited

U.S. PATENT DOCUMENTS

2014/0266375 A1* 9/2014 Feldman ............ A61N 1/36125
327/291

* cited by examiner

↓ SYNTHESIS

↓ SYNTHESIS

OSCILLATOR, ELECTRONIC DEVICE, AND MOVING OBJECT

BACKGROUND

1. Technical Field

The present invention relates to an oscillator in which an oscillation frequency is subjected to temperature compensation by using a variable capacitance element. Further, the invention relates to an electronic device, a moving object, and the like, that use such an oscillator.

2. Related Art

For example, in a temperature compensated crystal oscillator (TCXO), a variable capacitance element is used to perform temperature compensation for an oscillation frequency. A TCXO in the related art has a circuit configuration in which gain of an oscillation stage circuit is constant regardless of the temperature, in order to maintain constant amplitude of an oscillation signal. However, although the gain of the oscillation stage circuit is theoretically constant, the oscillation signal does not have the constant amplitude in a case where a crystal resonator has temperature-dependent impedance. When the amplitude of the oscillation signal changes, the absolute value and linearity of the sensitivity of the variable capacitance element changes.

In addition, the variable capacitance element has temperature-dependent sensitivity, and the absolute value and the linearity of the sensitivity of the variable capacitance element changes depending on the temperature. In this respect, when the temperature changes, the impedance of the crystal resonator or the sensitivity of the variable capacitance element changes and thus, the oscillation frequency of the TCXO changes. However, in recent years, there has been a high demand for high accuracy, and the TCXO is required to maintain a constant oscillation frequency even though the temperature changes.

As related technology, Japanese Patent No. 4985035 (paragraphs [0014] to [0018] and FIG. 1) discloses, in FIG. 1, an oscillation circuit that has an oscillation frequency with high accuracy even in a case where the temperature characteristics are significantly different for each sample. The oscillation circuit includes a reference resistor RE1 that generates a reference current, an integrated circuit 2 that is provided separately from the reference resistor, that has an operational amplitude AMP1 which supplies a current to the reference resistor, a reference voltage generating circuit 24 that determines a reference voltage which is applied to the reference resistor, and a constant-voltage circuit 21 which generates a constant voltage, and that determines the oscillation frequency based on the reference current and the constant voltage, and a register 25 that sets the temperature dependence of the reference voltage which is output from the reference voltage generating circuit such that the temperature dependence is the same as the temperature dependence of the reference resistor.

According to the oscillation circuit disclosed in Japanese Patent No. 4985035 (paragraphs [0014] to [0018] and FIG. 1), the reference resistor is provided outside the integrated circuit and thus, it is possible to use a resistor element having a small temperature dependence, compared to a case where the reference resistor is provided inside the integrated circuit. In addition, a value is set, for each reference resistor, to the resistor that sets the temperature dependence of the reference voltage, and thereby, even in a case where the temperature dependence of the reference resistor is different for each sample, it is possible to set the temperature dependence of the reference voltage in response to the difference. In this manner, even in a case where the temperature dependence of the resistor element is significantly different for each sample, it is possible to generate a constant current that is not dependent on the temperature.

However, it is complicated to set, in the register, the temperature dependence of the reference voltage for each sample. In addition, although a constant current that is not dependent on the temperature is supplied to the oscillation stage circuit of the TCXO, the impedance of the crystal resonator or the sensitivity of the variable capacitance element is dependent on the temperature and thus, it is not possible to maintain a constant oscillation frequency of the TCXO.

SUMMARY

A first advantage of some aspects of the invention is to provide an oscillator that has low influence of temperature dependence of impedance of a resonator on an oscillation frequency and thus, has highly accurate frequency-temperature characteristics. A second advantage of some aspects of the invention is to provide an oscillator that has low influence of temperature dependence of sensitivity of a variable capacitance element on an oscillation frequency and thus, has highly accurate frequency-temperature characteristics. A third advantage of some aspects of the invention is to provide an electronic device and a moving object using the oscillator.

An oscillator according to a first aspect of the invention includes: an oscillation stage circuit that is connected between a first electrode and a second electrode of a resonator and performs an oscillation operation; a variable capacitance element that is connected to the first or second electrode of the resonator and adjusts an oscillation frequency; a bandgap reference circuit that generates a reference voltage having magnitude, which changes depending on the temperature, by using a resistor inserted in a current path through which a current having magnitude, which changes depending on the temperature, flows; and a bias current generating circuit that generates a bias current of the oscillation stage circuit based on the reference voltage, and that, thereby, reduces a change in the oscillation frequency due to the temperature dependence of the impedance of the resonator or the temperature dependence of the sensitivity of the variable capacitance element.

According to the first aspect of the invention, it is possible to provide the oscillator that appropriately sets temperature characteristics of amplitude of an oscillation signal by using temperature characteristics of the reference voltage, thereby, reduces the change in the oscillation frequency due to the temperature dependence of the impedance of the resonator or the temperature dependence of the sensitivity of the variable capacitance element, and has highly accurate frequency-temperature characteristics.

The bandgap reference circuit may have a first current path to which a first resistor, a second resistor, and a first transistor or a first diode are connected in series, and a second current path to which a third resistor, a plurality of second transistors or a plurality of second diodes which are connected in parallel, respectively, and a fourth resistor are connected in series, and the reference voltage may be generated at a connection point between the first resistor and the second resistor. In this configuration, it is possible to generate the reference voltage having desired temperature characteristics by using a low-noise-designed bandgap reference circuit that is generally provided in a semiconductor device.

The bias current generating circuit may include a current adjusting resistor that has a temperature coefficient different from a temperature coefficient of a resistor included in the bandgap reference circuit, and may generate a bias current of the oscillation stage circuit based on the reference voltage and a resistance value of the current adjusting resistor. In this configuration, it is possible to increase flexibility in setting of temperature characteristics of the bias current by selecting and using a resistor having a desired temperature coefficient from the various resistors.

An oscillator according to a second aspect of the invention includes: an oscillation stage circuit that is connected between a first electrode and a second electrode of a resonator and performs an oscillation operation; a variable capacitance element that is connected to the first or second electrode of the resonator and adjusts an oscillation frequency; a bandgap reference circuit that generates a reference voltage; and a bias current generating circuit that includes a current adjusting resistor having a temperature coefficient different from a temperature coefficient of a resistor included in the bandgap reference circuit, that generates a bias current of the oscillation stage circuit based on the reference voltage and a resistance value of the current adjusting resistor, and that, thereby, reduces a change in the oscillation frequency due to the temperature dependence of the impedance of the resonator or the temperature dependence of the sensitivity of the variable capacitance element.

According to the second aspect of the invention, it is possible to provide the oscillator that selects and uses a resistor having an appropriate temperature coefficient from the various resistors, as the current adjusting resistor having an influence on the temperature characteristics of the bias current in the oscillation stage circuit, thereby, reduces the change in the oscillation frequency due to the temperature dependence of the impedance of the resonator or the temperature dependence of the sensitivity of the variable capacitance element, and has highly accurate frequency-temperature characteristics.

The current adjusting resistor may have the temperature coefficient higher than the temperature coefficient of the resistor included in the bandgap reference circuit. In this configuration, it is possible to increase a correction amount of the bias current with respect to the change in the impedance of the resonator or the change in the sensitivity of the variable capacitance element depending on the temperature.

The bias current generating circuit may supply a bias current having temperature dependence lower than temperature dependence of a current flowing through a current path of the bandgap reference circuit. In this configuration, it is possible to reduce an influence of the temperature dependence of the impedance of the resonator or the temperature dependence of the sensitivity of the variable capacitance element on the oscillation frequency, compared to an oscillator in the related art, in which a bias current proportional to a current of a bandgap reference circuit is supplied to an amplifier stage circuit.

An oscillator according to a third aspect of the invention includes: an oscillation stage circuit that is connected between a first electrode and a second electrode of a resonator and performs an oscillation operation; a variable capacitance element that is connected to the first or second electrode of the resonator and adjusts an oscillation frequency; a bandgap reference circuit that generates a reference voltage; a bias current generating circuit that generates a bias current of the oscillation stage circuit based on the reference voltage and a resistance value of the current adjusting resistor; and a setting circuit that sets a value of a resistor included in the bandgap reference circuit in response to data stored in a storage unit, or that generates a selection signal for selecting the current adjusting resistor from a plurality of resistors.

According to the third aspect of the invention, it is possible to change the temperature characteristics of the bias current according to the temperature dependence of the impedance or the like of the resonator in a case where a desired type of resonator is selected and used from a plurality of types of resonators. Therefore, it is possible to provide the oscillator that reduces the change in the oscillation frequency due to the temperature dependence of the impedance or the like of the resonator and has highly accurate frequency-temperature characteristics.

An electronic device according to a fourth aspect of the invention includes: the oscillator according to any one of the aspects described above. A moving object according to a fifth aspect of the invention includes: the oscillator according to any one of the aspects described above. According to the fourth or fifth aspect of the invention, it is possible to provide the electronic device or the moving object that operates in response to an accurate clock signal which is generated by the oscillator that reduces the change in the oscillation frequency due to the temperature dependence of the impedance or the like of the resonator and has highly accurate frequency-temperature characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the figures. Note that the same reference sighs are assigned to the same components, and repeated description will be omitted. In the following embodiments, as an example of an oscillator, a temperature compensated crystal oscillator (TCXO) using a crystal resonator will be described.

First Embodiment

Figure 1:
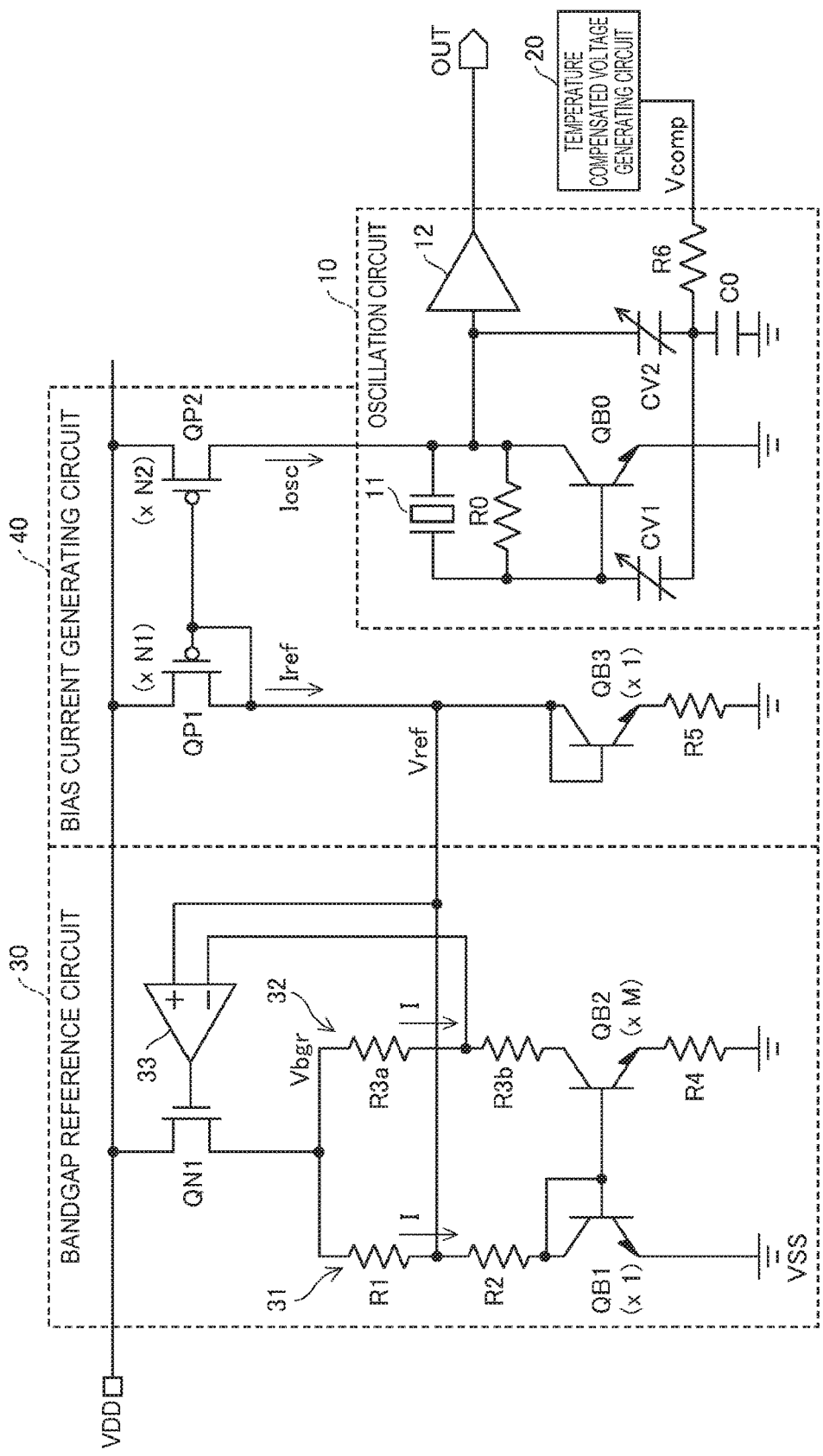
FIG. 1 is a circuit diagram illustrating a configurational example of an oscillator according to a first embodiment of the invention.

FIG. 1 is a circuit diagram illustrating a configurational example of an oscillator according to a first embodiment of the invention. As illustrated in FIG. 1, the oscillator may include an oscillation circuit 10, a temperature compensated voltage generating circuit 20, a bandgap reference circuit 30, and a bias current generating circuit 40. Otherwise, the oscillator may have a configuration in which a part of the oscillation circuit 10 to the bias current generating circuit 40 is incorporated in a semiconductor device (IC).

The oscillation circuit 10 may include a crystal resonator 11, an NPN bipolar transistor QB0, resistors R0 and R6, variable capacitance elements CV1 and CV2, a capacitor C0, and an output buffer circuit 12. Otherwise, one of the variable capacitance elements CV1 and CV2 may be omitted. Here, the transistor QB0 and the resistor R0 configure an oscillation stage circuit that is connected between a first electrode and a second electrode of the crystal resonator 11 and performs an oscillation operation.

The transistor QB0 has a base connected to the first electrode of the crystal resonator 11, a collector connected to the second electrode of the crystal resonator 11, and an emitter connected to a wire of a reference potential VSS. The resistor R0 is connected between the collector and the base of the transistor QB0.

The variable capacitance element CV1 has a first terminal connected to the first electrode of the crystal resonator 11 and adjusts an oscillation frequency of the oscillation circuit 10. The variable capacitance element CV2 has a first terminal connected to the second electrode of the crystal resonator 11 and adjusts the oscillation frequency of the oscillation circuit 10. The capacitor C0 is connected between second terminals of the variable capacitance elements CV1 and CV2 and the wire of the reference potential VSS. Each of the variable capacitance elements CV1 and CV2 is configured to have, for example, a capacitor having a MOS structure or a variable capacitance diode (varactor diode), and has a capacitance value that changes depending on a voltage applied between the first terminal and the second terminal.

The transistor QB0 performs an inverting amplification operation and an oscillation signal generated at the collector is fed back to the base via the crystal resonator 11. At this time, the crystal resonator 11 vibrates by an AC voltage applied by the transistor QB0. The vibration is significantly excited due to a natural resonant frequency such that the crystal resonator 11 operates as a negative resistor.

As a result, the oscillation circuit 10 mainly oscillates at an oscillation frequency that is determined by the resonant frequency of the crystal resonator 11. Here, the capacitance values of the variable capacitance elements CV1 and CV2 change, thereby making it possible to perform fine adjustment of the oscillation frequency of the oscillation circuit 10. The oscillation signal generated by the oscillation circuit 10 is supplied to an output terminal OUT via the output buffer circuit 12.

Figure 2:
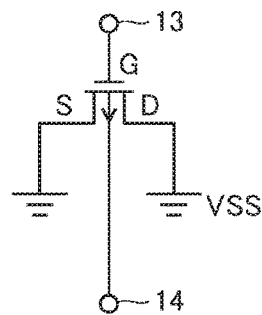
FIG. 2 is diagram illustrating an example of a variable capacitance element illustrated in FIG. 1.

FIG. 2 is diagram illustrating a capacitor having a MOS structure as an example of the variable capacitance element illustrated in FIG. 1. The capacitor illustrated in FIG. 2 is configured of a P-channel MOS transistor, and has a gate (G) connected to a first terminal 13, a source (S) and a drain (D) connected to a wire of the reference potential VSS, and a back gate (N-well) connected to a second terminal 14. A capacitance value of the capacitor depends on the length of the gate, the width of the gate, the thickness of an insulation membrane of the gate, and the like, of the MOS transistor.

When a voltage between the first terminal 13 and the second terminal 14 of the capacitor is increased, a depletion layer formed in the back gate is gradually expanded, and the capacitance value of the capacitor gradually increases. Also, when the voltage is increased to a certain extent, the back gate is saturated to have an amount of charge charged therein and the capacitor is saturated to have the capacitance value.

Figure 3:
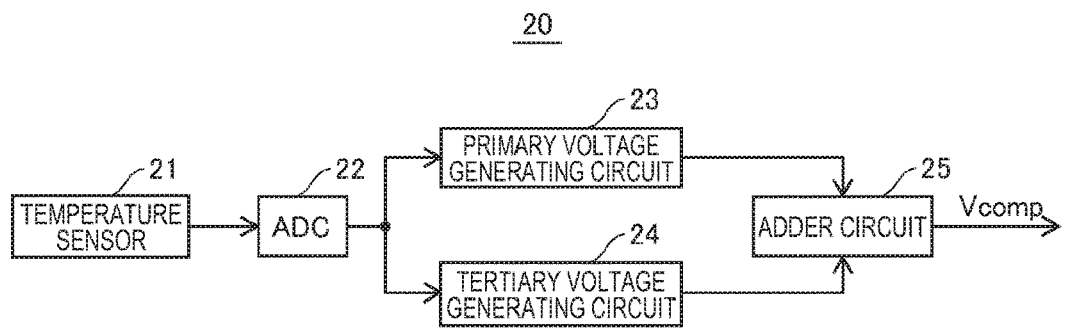
FIG. 3 is a block diagram illustrating a configurational example of a temperature compensated voltage generating circuit illustrated in FIG. 1.

FIG. 3 is a block diagram illustrating a configurational example of the temperature compensated voltage generating circuit illustrated in FIG. 1. The temperature compensated voltage generating circuit 20 generates, in response to a detection signal output from a temperature sensor, a temperature compensated voltage Vcomp that controls the capacitance values of the variable capacitance elements CV1 and CV2. The temperature compensated voltage Vcomp is supplied to the second terminals of the variable capacitance elements CV1 and CV2 via the resistor R6.

As illustrated in FIG. 3, the temperature compensated voltage generating circuit 20 may include a temperature sensor 21, an AD converter 22, a primary voltage generating circuit 23, a tertiary voltage generating circuit 24, and an adder circuit 25.

The temperature sensor 21 has, for example, a PN junction diode, a transistor, or a thermistor, and an amplifier circuit, and detects a temperature around the oscillator, and outputs a detection signal. The AD converter 22 converts an analog detection signal output from the temperature sensor 21 into digital temperature data.

The primary voltage generating circuit 23 and the tertiary voltage generating circuit 24 have, for example, a storage unit that stores, corresponding to temperature data, voltage data representing a primary voltage and a tertiary voltage having temperature characteristics which compensate temperature dependence of the resonant frequency of the crystal resonator 11, respectively, and a DA converter. The primary voltage generating circuit 23 and the tertiary voltage generating circuit 24 read, from the storage unit, the voltage data corresponding to the temperature data output from the AD converter 22, and converts the voltage data into the primary voltage and the tertiary voltage and outputs the voltages.

The adder circuit 25 adds the primary voltage output from the primary voltage generating circuit 23 and the tertiary voltage output from the tertiary voltage generating circuit 24 and generates the temperature compensated voltage Vcomp. The temperature compensated voltage Vcomp is set to a predetermined value in a case where the oscillation circuit 10 oscillates with a reference frequency $f_0$ at a reference temperature (for example, 25° C.)

When the temperature compensated voltage Vcomp is lower than the predetermined value, the capacitance values of the variable capacitance elements CV1 and CV2 increase and thus, the oscillation frequency is lowered. By contrast, when the temperature compensated voltage Vcomp is higher than the predetermined value, the capacitance values of the variable capacitance elements CV1 and CV2 decrease and thus, the oscillation frequency increases.

Otherwise, the temperature compensated voltage generating circuit 20 may be configured of only an analog circuit without using the AD converter 22. In this case, the primary voltage generating circuit 23 and the tertiary voltage generating circuit 24 generate the primary voltage and the tertiary voltage, respectively, which have the temperature characteristics that compensate temperature dependence of the resonant frequency of the crystal resonator 11, based on the analog detection signal output from the temperature sensor 21.

With reference to FIG. 1 again, the bandgap reference circuit 30 has a first current path 31 and a second current path 32. The bandgap reference circuit 30 operates with a power-supply voltage (VDD-VSS) supplied, and, for example, generates a reference voltage Vref having magnitude, which changes depending on the temperature, by using a resistor R1 inserted in the first current path 31 through which a current having magnitude, which changes depending on the temperature, flows.

The first resistor R1, a second resistor R2, and an NPN bipolar transistor QB1 are connected to the first current path 31 in series. Third resistors R3a and R3b, an NPN bipolar transistor QB2 configured to have a plurality of transistors connected in parallel, and a fourth resistor R4 are connected to the second current path 32 in series.

In the example illustrated in FIG. 1, the third resistor is configured to have the two resistors R3a and R3b which are connected in series; however, when a circuit configuration of supplying the current to the first current path 31 and the second current path 32 is changed, the third resistor can be configured of one resistor. In addition, one diode may be used instead of the transistor QB1 and a plurality of diodes may be used instead of the transistor QB2. In this case, the connection order of the resistors and the diodes may be changed.

The transistor QB1 has a collector and a base connected to one end of the resistor R2 and an emitter connected to the wire of the reference potential VSS. The transistor QB2 has a collector connected to one end of the resistor R3b, an emitter connected to one end of the resistor R4, and a base connected to the base of the transistor QB1. The transistor QB2 is configured to have M transistors having the same size as the transistor QB1 and the M transistors are connected in parallel.

Further, the bandgap reference circuit 30 has an N-channel MOS transistor QN1 and an operational amplifier 33. The transistor QN1 has a drain connected to a wire of the power-supply potential VDD and a source connected to one end of the resistor R1 and one end of the resistor R3a. The operational amplifier 33 has a non-inverting input terminal connected to a connection point between the resistor R1 and the resistor R2, an inverting input terminal connected to a connection point between the resistor R3a and the resistor R3b, and an output terminal connected to a gate of the transistor QN1.

Here, the resistance value of the resistor R1 and the resistance value of the resistor R3a are set to be equal to each other. Hence, the operational amplifier 33 controls a gate potential of the transistor QN1 such that an amount of the current flowing through the first current path 31 is equal to an amount of the current flowing through the second current path 32. Thus, reference currents I flow the first current path 31 and the second current path 32, respectively.

For example, the resistance values of the resistors R1 to R3b are set to be represented by the following Equation (1).

$$R1 + R2 = R3a + R3b = Rc \qquad (1)$$

In addition, a voltage between the base-emitter of the transistor QB1 is equal to the sum of a voltage between the base-emitter of the transistor QB2 and a voltage between both ends of the resistor R4.

Hence, the reference current I is represented by the following Equation (2) using a thermal voltage Vt (=kT/q).

$$I = Vt \times \ln(M)/R4 \qquad (2)$$
$$= (kT/q) \times \ln(M)/R4$$

Here, k is a Boltzmann's constant, T is an absolute temperature, and q is charge of an electron. The reference current I has positive temperature characteristics (proportion of a current changing rate to a temperature change), and a value of the current increases depending on an increase in temperature.

When a forward voltage between the base-emitter of the transistor QB1 is Vf, a bandgap reference voltage Vbgr is represented by the following Equation (3).

$$Vbgr = Rc \times I + Vf \qquad (3)$$
$$= Rc \times Vt \times \ln(M)/R4 + Vf$$
$$= Rc \times (kT/q) \times \ln(M)/R4 + Vf$$

In Equation (3), the thermal voltage Vt has the positive temperature characteristics, and the forward voltage Vf between the base-emitter of the transistor QB1 has negative temperature characteristics.

Hence, a resistance ratio of Rc/R4, or the M transistors that are connected in parallel and configure the transistor QB2 are appropriately set, and thereby the bandgap reference voltage Vbgr is not dependent on the temperature. The bandgap reference voltage Vbgr generated in this manner is supplied to another circuit that needs a positive voltage.

In addition, the bandgap reference circuit 30 generates the reference voltage Vref represented by the following Equation (4) at the connection point between the resistor R1 and the resistor R2.

$$Vref = Vbgr - I \times R1 \qquad (4)$$
$$= Vbgr - Vt \times \ln(M) \times R1/R4$$
$$= Vbgr - (kT/q) \times \ln(M) \times R1/R4$$

In Equation (4), since the thermal voltage Vt has the positive temperature characteristics, the reference voltage Vref has the negative temperature characteristics (proportion of a voltage changing rate to the temperature change), and the value of the voltate decreases depending on an increase in temperature. In this configuration, it is possible to generate the reference voltage Vref having desired temperature characteristics, by using a low-noise-designed bandgap reference circuit which is generally provided in a semiconductor device.

Figure 4:
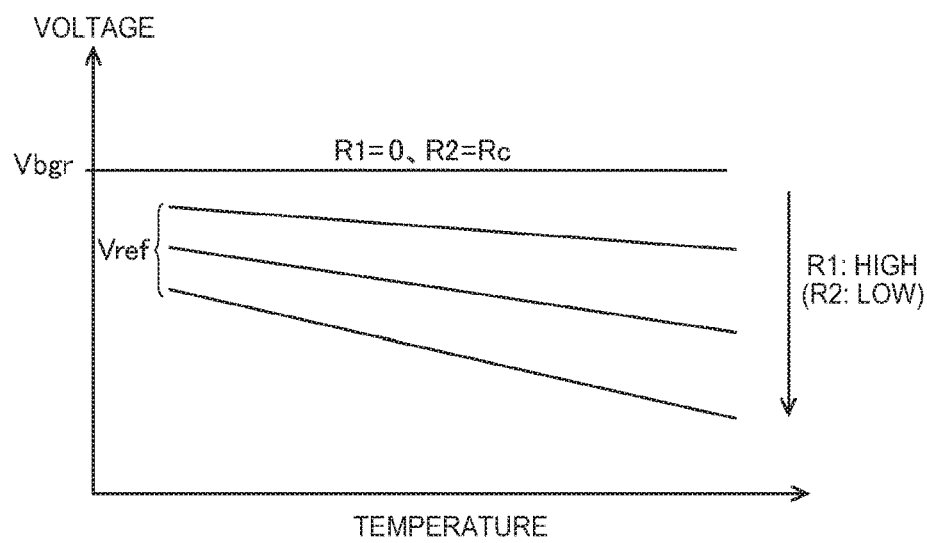
FIG. 4 is a graph illustrating a change in a reference voltage depending on the temperature.

FIG. 4 is a graph illustrating a change in the reference voltage depending on the temperature. In FIG. 4, the horizontal axis represents the temperature and the vertical axis represents the voltage. As illustrated in FIG. 4, the bandgap reference voltage Vbgr is constant in a predetermined temperature range and the reference voltage Vref decreases depending on an increase in temperature.

The temperature characteristics (an inclination angle illustrated in FIG. 4) of the reference voltage Vref can be set depending on the resistance values of the resistors R1 and R2. In other words, in a case where a sum of the resistance value of the resistor R1 and the resistance value of the resistor R2 is a constant value Rc, it is possible to increase the inclination angle of the reference voltage Vref when the resistance value of the resistor R1 is increased and the resistance value of the resistor R2 is decreased. Conversely, in a case where R1=0, and R2=Rc, the reference voltage Vref is equal to the bandgap reference voltage Vbgr.

With reference to FIG. 1 again, the bandgap reference circuit 30 outputs the reference voltage Vref to the bias current generating circuit 40. The bias current generating circuit 40 generates a bias current of the oscillation stage circuit based on the reference voltage Vref, and thereby reduces a change in the oscillation frequency due to the temperature dependence of the impedance of the crystal resonator 11 or the temperature dependence of the sensitivity (proportion of the capacitance changing rate to the voltage change) of the variable capacitance elements CV1 and CV2.

The bias current generating circuit 40 has P-channel MOS transistors QP1 and QP2, an NPN bipolar transistor QB3, and a current adjusting resistor R5. The transistor QP1 has a source connected to the wire of the power-supply potential VDD and a drain and a gate connected to the wire of the reference voltage Vref. The transistor QP2 has a source connected to the wire of the power-supply potential VDD, a drain connected to the oscillation stage circuit, and a gate connected to the gate of the transistor QP1. For example, the transistor QP1 is configured of N1 transistors which are connected in parallel, and the transistor QP2 is configured of N2 transistors which are connected in parallel. Here, N1 and N2 are natural numbers.

The transistor QB3 has a collector and a base connected to the wire of the reference voltage Vref. The current adjusting resistor R5 is connected between an emitter of the transistor QB3 and the wire of the reference potential VSS. A reference current Iref represented by the following Equation (5) flows in the transistor QB3 with a forward voltage between the base-emitter of the transistor QB3 as Vf.

$$Iref=(Vref-Vf)/R5 \quad (5)$$

The reference current Iref flows also in the transistor QP1. The transistors QP1 and QP2 configure a current mirror circuit and a drain current of (N2/N1) times a drain current of the transistor QP1 flows in the transistor QP2. Hence, a bias current Iosc that is supplied to the oscillation stage circuit is represented by the following Equation (6), with a proportional constant as α.

$$Iosc=\alpha \times (Vref-Vf)/R5 \quad (6)$$

A gain (voltage amplification factor) G of the oscillation stage circuit is represented by the following Equation (7), with the impedance of a load of the oscillation stage circuit as $Z_L$.

$$\begin{aligned} G &= Z_L/r_e \\ &= Z_L/\{(kT/q)/Iosc\} \\ &= Z_L \times Iosc/(kT/q)\} \end{aligned} \quad (7)$$

In the related art, a current proportional to the reference current I represented by Equation (2) is used as the bias current Iosc that is supplied to the oscillation stage circuit. In this case, a gain G1 of the oscillation stage circuit is represented by the following Equation (8).

$$G1=\alpha \times Z_L \times \ln(M)/R4 \quad (8)$$

In Equation (8), when the impedance $Z_L$ of the load and the resistance value of the resistor R4 are not dependent on the temperature, the gain G1 of the oscillation stage circuit is constant regardless of the temperature.

However, as illustrated in FIG. 1, in a case where the crystal resonator 11 is connected as a load to the oscillation stage circuit and at least the impedance of the crystal resonator 11 is dependent on the temperature, the gain G1 of the oscillation stage circuit is not constant, and thus, the amplitude of the oscillation signal changes. When the amplitude of the oscillation signal changes, the absolute value and the linearity of the sensitivities of the variable capacitance elements CV1 and CV2 change, and the oscillation frequency of the oscillation circuit 10 changes depending on the temperature.

Figure 5:
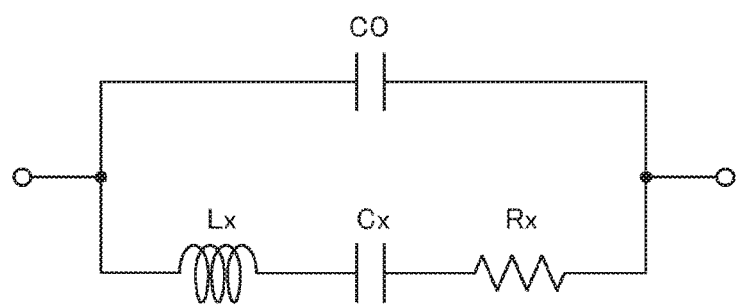
FIG. 5 is a diagram illustrating an equivalent circuit of a crystal resonator illustrated in FIG. 1.

FIG. 5 is a diagram illustrating an equivalent circuit of the crystal resonator illustrated in FIG. 1. As illustrated in FIG. 5, on the equivalent circuit of the crystal resonator 11, an inductor Lx, a capacitor Cx, and a resistor Rx are connected to a circuit in series, and the capacitor C0 is connected thereto in parallel. In particular, the resistor Rx often has positive or negative temperature characteristics due to an influence of spurious or the like, and the temperature characteristics influence the amplitude of the oscillation signal.

Figure 6A:
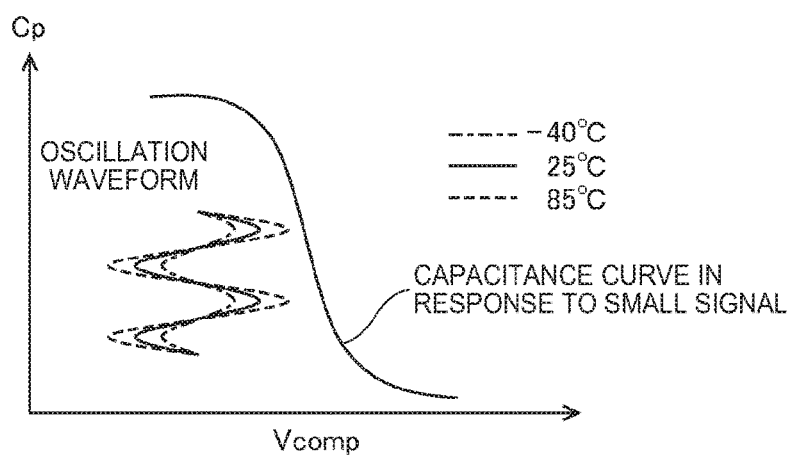
FIGS. 6A and 6B are graphs depicting a temperature compensation operation in an oscillation circuit illustrated in FIG. 1.
Figure 6B:
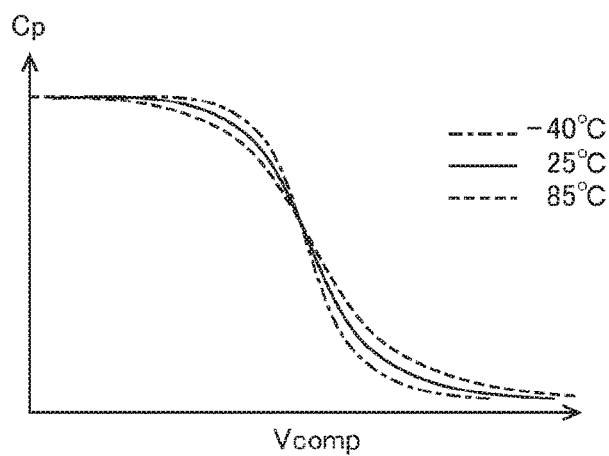

FIGS. 6A and 6B are graphs depicting a temperature compensation operation in the oscillation circuit illustrated in FIG. 1. In FIGS. 6A and 6B, the horizontal axis represents the temperature compensated voltage Vcomp, and the vertical axis represents a capacitance value Cp of the variable capacitance element CV1 or CV2.

FIG. 6A illustrates synthesis of an oscillation waveform of the oscillation circuit 10 to a capacitance curve in response to a small signal. In other words, since the oscillation signal is applied to one terminal of the variable capacitance element CV1 or CV2, and the temperature compensated voltage Vcomp is applied to the other terminal thereof, a difference between the oscillation signal and the temperature compensated voltage Vcomp is applied between the two terminals of the variable capacitance element CV1 or CV2.

As a result, as illustrated in FIG. 6B, as the amplitude of the oscillation signal is increased, a slope of a change of the capacitance value Cp of the variable capacitance elements CV1 and CV2 becomes more gradual. Hence, when the amplitude of the oscillation signal changes depending on the temperature, the absolute value and the linearity of the sensitivities of the variable capacitance elements CV1 and CV2 are degraded.

In the embodiment, the bias current Iosc represented by Equation (6) is supplied to the oscillation stage circuit. In this case, a gain G2 of the oscillation stage circuit is represented by the following Equation (9).

$$G2=\alpha \times Z_L \times (Vref-Vf)/R5/(kT/q) \quad (9)$$

Hence, although the impedance of the crystal resonator 11 is dependent on the temperature, the temperature characteristics (proportion of the amplitude changing rate to the temperature change) of the amplitude of the oscillation signal are appropriately set by using the temperature characteristics of the reference voltage Vref, thereby, making it possible to reduce the change in the oscillation frequency due to the temperature dependence of the impedance of the crystal resonator 11.

In addition, the sensitivities of the variable capacitance elements CV1 and CV2 are dependent on the temperature; however, as will be described below, the temperature characteristics of the amplitude of the oscillation signal are appropriately set by using the temperature characteristics of the reference voltage Vref, thereby making it possible to reduce the change in the oscillation frequency due to the temperature dependence of the sensitivities of the variable capacitance elements CV1 and CV2.

FIGS. 7A to 7D illustrate graphs showing characteristics of the variable capacitance element illustrated in FIG. 1. In FIGS. 7A to 7D, the horizontal axis represents the temperature compensated voltage Vcomp. In addition, in FIGS. 7A and 7B, the vertical axis represents the capacitance value Cp of the variable capacitance element CV1 or CV2, and in FIGS. 7C and 7D, the vertical axis represents the sensitivity (ppm/V) of the variable capacitance element CV1 or CV2.

Figure 7A:
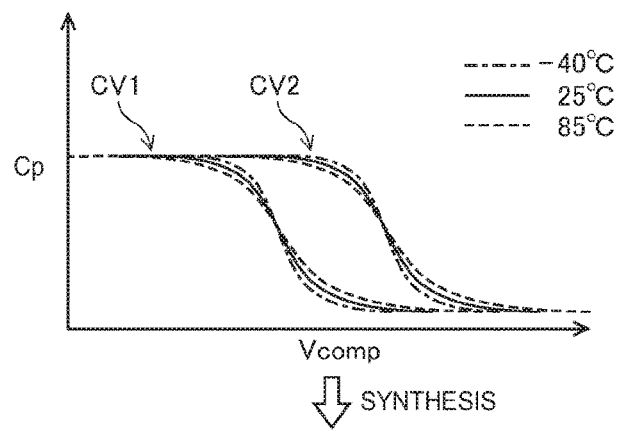
FIGS. 7A to 7D illustrate graphs showing characteristics of the variable capacitance element illustrated in FIG. 1.
Figure 7B:
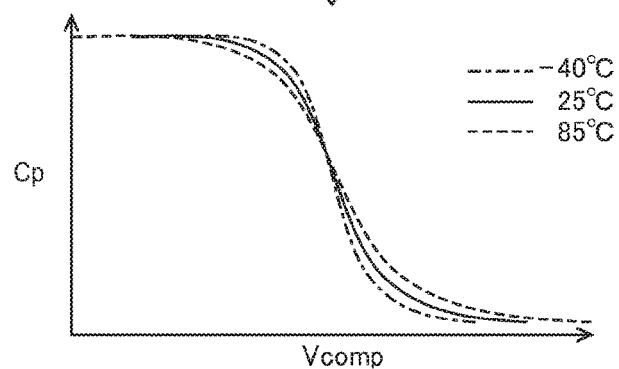

FIG. 7A illustrates change curves of the capacitance values Cp of the respective variable capacitance elements CV1 and CV2 by the temperature compensated voltage Vcomp. As illustrated in FIG. 7A, the change curves of the capacitance values Cp thereof, respectively, change depending on the temperature. FIG. 7B illustrates respective change curves of the synthesized capacitance values Cp of the variable capacitance elements CV1 and CV2 by the temperature compensated voltage Vcomp. As illustrated in FIG. 7B, the change curves of the synthesized capacitance values Cp also change depending on the temperature.

Figure 7C:
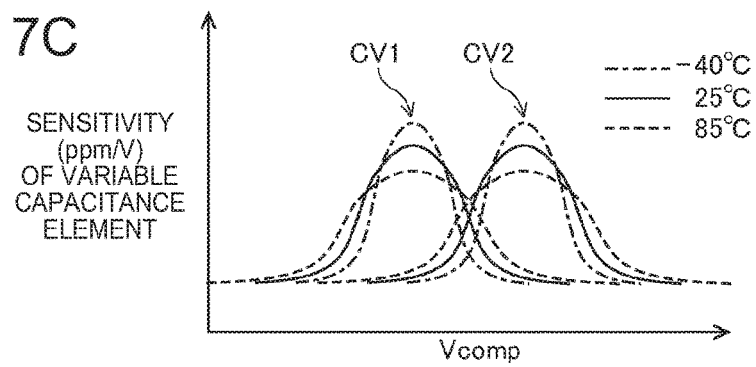
Figure 7D:
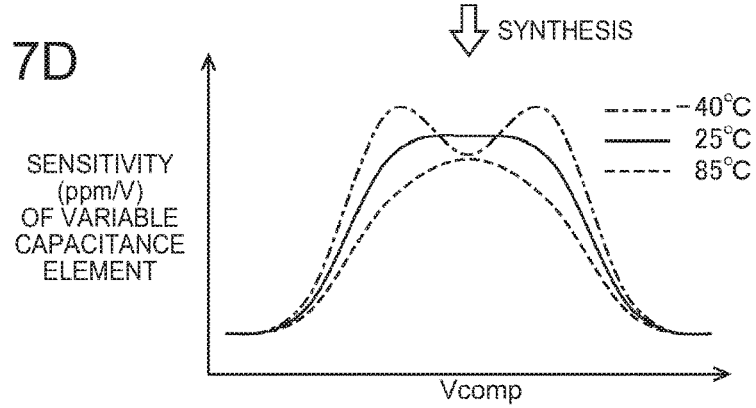

FIG. 7C illustrates change curves of the sensitivities of the respective variable capacitance elements CV1 and CV2 by the temperature compensated voltage Vcomp. As illustrated in FIG. 7C, the change curves of the sensitivities thereof, respectively, also change depending on the temperature. FIG. 7D illustrates change curves of the synthesized sensitivities of the variable capacitance elements CV1 and CV2 by the temperature compensated voltage Vcomp. As illustrated in FIG. 7D, the change curves of the synthesized sensitivities thereof, also change depending on the temperature. In this manner, the absolute value and the linearity of the sensitivities of the variable capacitance elements CV1 and CV2 are degraded also by the temperature dependence of the sensitivities of the variable capacitance elements CV1 and CV2.

Figure 8A:
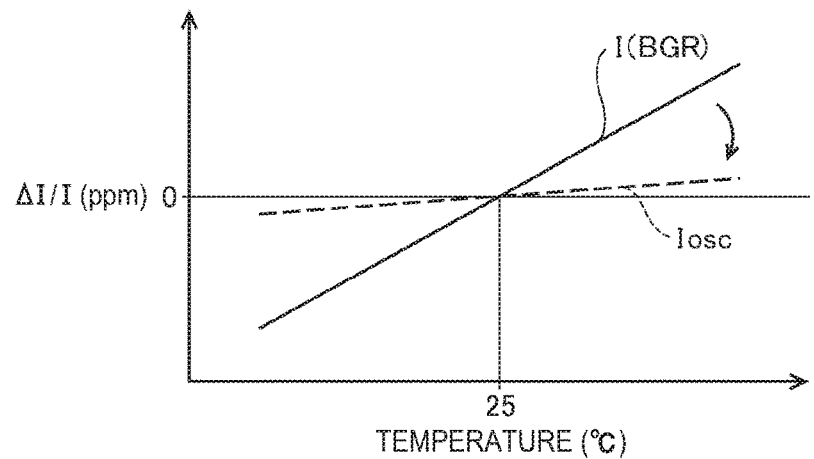
FIGS. 8A to 8C are graphs illustrating a relationship between temperature characteristics of a bias current and the sensitivity of the variable capacitance element.
Figure 8B:
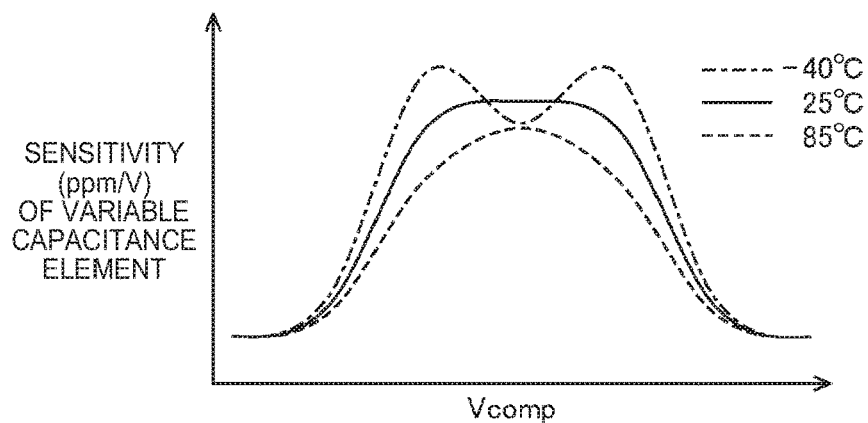
Figure 8C:
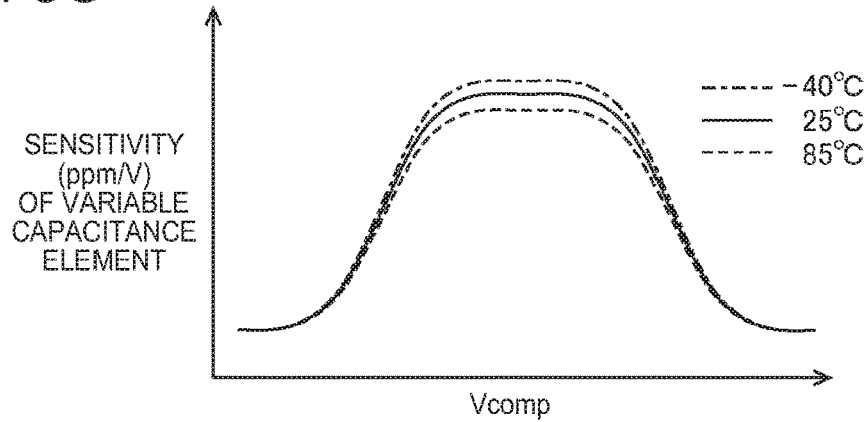

FIGS. 8A to 8C are graphs illustrating a relationship between the temperature characteristics of the bias current and the sensitivity of the variable capacitance element. In FIG. 8A, the horizontal axis represents the temperature (° C.) and the vertical axis represents a current changing rate ΔI/I (ppm). In FIGS. 8B and 8C, the horizontal axis represents the temperature compensated voltage Vcomp, and the vertical axis represents the sensitivities (ppm/V) of the variable capacitance elements CV1 and CV2.

A solid line in FIG. 8A represents a bias current I (BGR) proportional to the reference current I flowing through the current path 31 or 32 of the bandgap reference circuit 30 illustrated in FIG. 1. As represented in Equation (2), the bias current I (BGR) has the positive temperature characteristics that is increased depending on an increase in the temperature. When the bias current I (BGR) is supplied to the oscillation stage circuit, as illustrated in FIG. 8B, the synthesized sensitivity of the variable capacitance elements CV1 and CV2 has two peaks at a low temperature (−40° C.) and thus, the curve undulates.

By comparison, a dashed line in FIG. 8A represents the bias current Iosc generated by the bias current generating circuit 40 illustrated in FIG. 1. For example, in a case where the impedance of the crystal resonator 11 has the positive temperature characteristics, the bias current generating circuit 40 may supply the bias current Iosc that has the temperature dependence smaller than the temperature dependence of the reference current I flowing through the current path 31 or 32 of the bandgap reference circuit 30.

In this case, the slope of the temperature characteristics of the bias current Iosc is more gradual than the slope of the temperature characteristics of the bias current I (BGR) so as to rotate toward the negative side. Further, the slope of the temperature characteristics of the bias current Iosc may have a negative value. When such a bias current Iosc is supplied to the oscillation stage circuit, the amplitude of the oscillation signal increases at a low temperature (−40° C.), and the slope of the change in the capacitance values Cp of the variable capacitance elements CV1 and CV2 become gradual as illustrated in FIGS. 6A and 6B.

As a result, as illustrated in FIG. 8C, the values of the two peaks of the synthesized sensitivity of the variable capacitance elements CV1 and CV2 are reduced and the curve is less undulated. It is possible to correct remaining primary temperature characteristics by the temperature compensated voltage generating circuit 20. In this manner, it is possible to reduce an influence of the temperature dependence of the impedance of the crystal resonator 11 or the temperature dependence of the sensitivities of the variable capacitance elements CV1 and CV2 on the oscillation frequency, compared to an oscillator in the related art in which a bias current proportional to the current of the bandgap reference circuit 30 is supplied to an amplifier stage circuit.

In this manner, according to the embodiment, it is possible to provide the oscillator that appropriately sets temperature characteristics of the amplitude of the oscillation signal by using the temperature characteristics of the reference voltage Vref, thereby, reduces the change in the oscillation frequency due to the temperature dependence of the impedance of the crystal resonator 11 or the temperature dependence of the sensitivities of the variable capacitance elements CV1 and CV2, and has highly accurate frequency-temperature characteristics.

Second Embodiment

In the second embodiment of the invention, in the oscillator illustrated in FIG. 1, the bias current generating circuit 40 includes the current adjusting resistor R5 having a temperature coefficient different from the temperature coefficients of the resistors R1 to R4 included in the bandgap reference circuit 30, and generates the bias current Iosc of the oscillation stage circuit, based on the reference voltage Vref and a resistance value of the current adjusting resistor R5. Except for this, the second embodiment is the same as the first embodiment.

Figure 9:
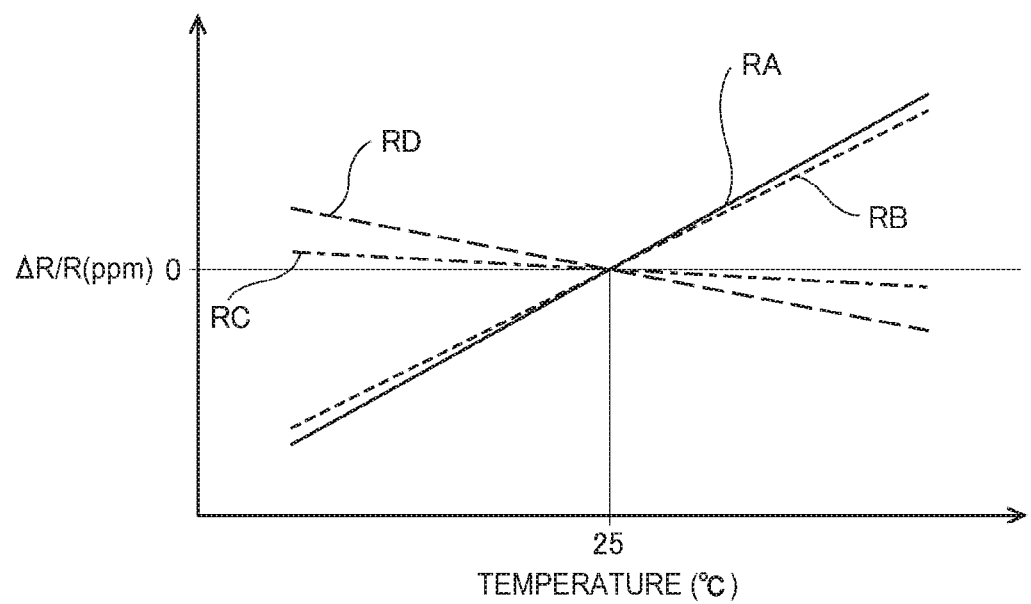
FIG. 9 is a graph illustrating temperature characteristics of various resistors that can be used in a semiconductor device.

FIG. 9 is a graph illustrating temperature coefficients of various resistors that can be used in a semiconductor device. In FIG. 9, the horizontal axis represents the temperature (° C.), and the vertical axis represents a resistance value changing rate ΔR/R (ppm). A resistor RA is, for example, an N-type diffusion resistor, a resistor RB is, for example, a P-type diffusion resistor, a resistor RC is, for example, an N-type polysilicon resistor, and a resistor RD is, for example, a P-type polysilicon resistor.

For example, the diffusion resistor is configured of an N-type or P-type impurity diffusion region formed on a semiconductor substrate, and the polysilicon resistor is configured of polysilicon containing N-type or P-type impurities formed on the semiconductor substrate via an insulation membrane. As illustrated in FIG. 9, the resistors RA and RB have the positive temperature coefficients and the resistors RC and RD have the negative temperature coefficients.

Hence, as represented in Equation (6), it is possible to use a resistor having a desired temperature coefficient as the current adjusting resistor R5 that influences the temperature characteristics of the bias current Iosc. The bias current generating circuit 40 may include the current adjusting resistor R5 having the temperature coefficient different from the temperature coefficients of the resistors R1 to R4 included in the bandgap reference circuit 30, and may generate the bias current Iosc of the oscillation stage circuit, based on the reference voltage Vref and the resistance value of the current adjusting resistor R5. Thus, it is possible to increase flexibility in setting of the temperature characteristics of the bias current Iosc by selecting and using a resistor having the desired temperature coefficient from the various resistors.

For example, the resistor RC or RD is used as the resistors R1 to R4 included in the bandgap reference circuit 30 illustrated in FIG. 1, and the resistor RA or RB is used as the current adjusting resistor R5 included in the bias current generating circuit 40. In this case, the current adjusting resistor R5 has the temperature coefficient higher than the temperature coefficients of the resistors R1 to R4 included in the bandgap reference circuit 30. In this manner, the slope of the temperature characteristics of the bias current Iosc represented in Equation (6) rotates toward the negative side such that it is possible to increase a correction amount of the bias current Iosc with respect to the change in the impedance of the crystal resonator 11 or the change in the sensitivities of the variable capacitance elements CV1 and CV2 depending on the temperature.

In this manner, in the second embodiment, since it is possible to adjust the temperature characteristics of the bias current Iosc by the types of resistors used as the current adjusting resistor R5, the reference voltage Vref may not be changed in magnitude depending on the temperature. For example, the resistor R1 is omitted in the oscillator illustrated in FIG. 1, and thereby, as illustrated in FIG. 4, the reference voltage Vref may be equal to the bandgap reference voltage Vbgr when R1=0 and R2=Rc.

According to the second embodiment, it is possible to provide the oscillator that appropriately selects and uses, as the current adjusting resistor R5 having an influence on the temperature characteristics of the bias current Iosc in the oscillation stage circuit, a resistor having an appropriate temperature coefficient from the various resistors, thereby, reduces the change in the oscillation frequency due to the temperature dependence of the impedance of the crystal resonator 11 or the temperature dependence of the sensitivities of the variable capacitance elements CV1 and CV2, and has highly accurate frequency-temperature characteristics.

Third Embodiment

Figure 10:
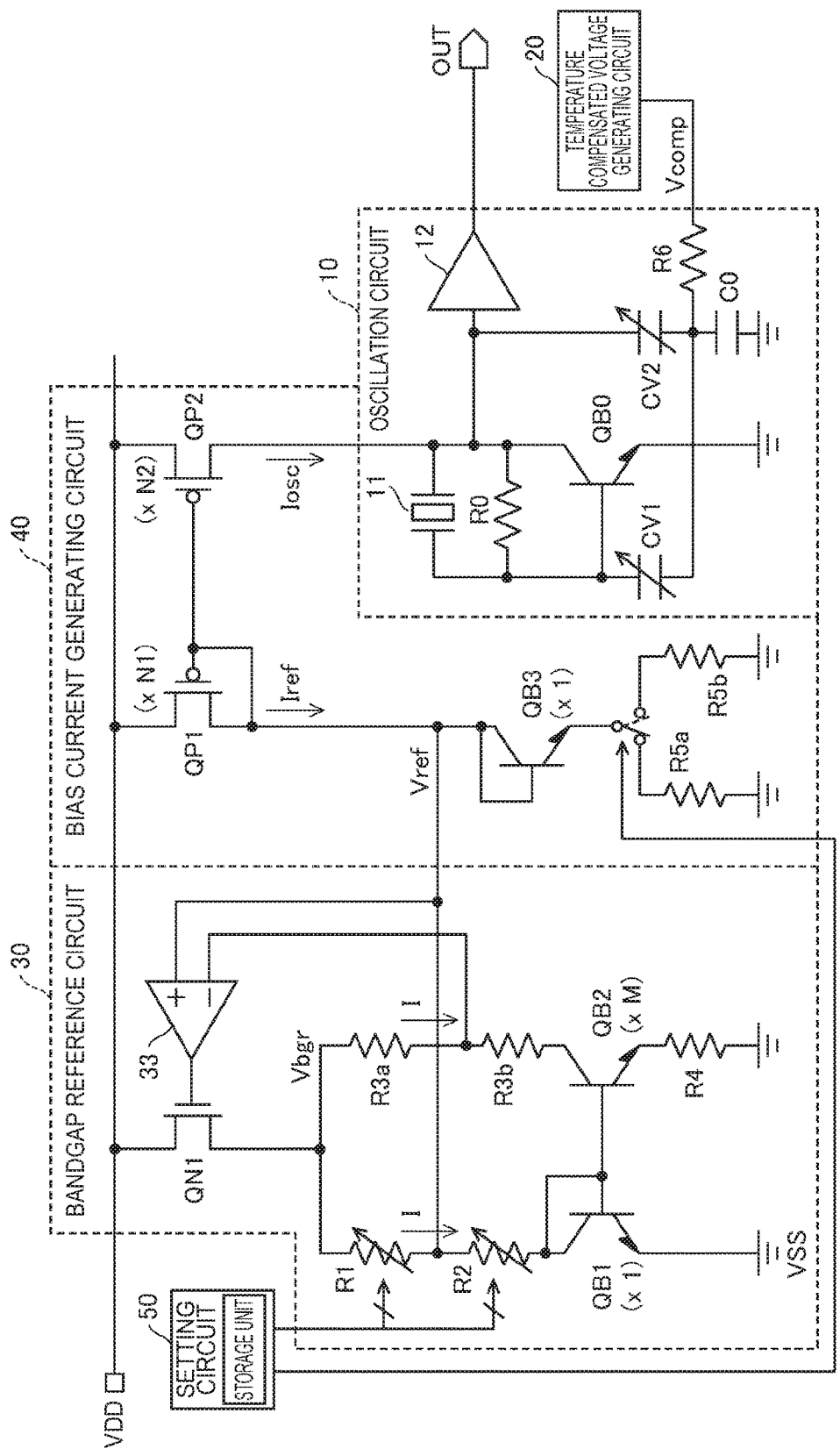
FIG. 10 is a circuit diagram illustrating a configurational example of an oscillator according to a third embodiment of the invention.

FIG. 10 is a circuit diagram illustrating a configurational example of an oscillator according to the third embodiment of the invention. In the third embodiment, it is possible to change the resistance values of the resistors R1 and R2 in the bandgap reference circuit 30, or it is possible to select a current adjusting resistor in the bias current generating circuit 40, and thus a setting circuit 50, which sets the resistance value and the current adjusting resistor, is provided. The setting circuit 50 may configure a part of the oscillator incorporated in the semiconductor device (IC). Except for this, the third embodiment may be the same as the first embodiment.

The bandgap reference circuit 30 includes the resistors R1 and R2 having changeable resistance values. For example, each of the resistors R1 and R2 includes a plurality of resistors having resistance values different from each other, and a plurality of transmission gates that are connected to the resistors, respectively. The setting circuit 50, for example, includes a storage unit configured of a memory or the like, and data supplied from an external device is stored in the storage unit.

Setting data, which is used in setting of the resistance values of the resistors R1 and R2, is stored in the storage unit of the setting circuit 50. The setting circuit 50 generates a plurality of control signals, which turn on or off the plurality of transmission gates, respectively, in response to the setting data stored in the storage unit, so as to supply the control signals to the resistors R1 and R2, thereby setting the resistance values of the resistors R1 and R2.

Otherwise, the bias current generating circuit 40 includes a plurality of resistors R5a and R5b having different temperature coefficients from each other, and a selector 41 that selects one from the plurality of resistors R5a and R5b. For example, the resistor R5a is an N-type or P-type diffusion resistor, and the resistor R5b is an N-type or P-type polysilicon resistor. The selector 41 is configured of, for example, a multiplexer or the like.

Selection data, which is used in selection of the current adjusting resistor, is stored in the storage unit of the setting circuit 50. The setting circuit 50 generates a selection signal for selecting the current adjusting resistor from the plurality of resistors R5a and R5b, in response to the selection data stored in the storage unit, and supplies the selection signal to the selector 41. In this manner, the selector 41 selects the current adjusting resistor.

According to the third embodiment, it is possible to change the temperature characteristics of the bias current Iosc according to the temperature dependence of the impedance or the like of the crystal resonator 11 in a case where the desired type of crystal resonator is selected and used as the crystal resonator 11 illustrated in FIG. 10 from the plurality of types of crystal resonators. Therefore, it is possible to provide the oscillator that reduces the change in the oscillation frequency due to the temperature dependence of the impedance or the like of the crystal resonator 11 and has highly accurate frequency-temperature characteristics.

Electronic Device

Next, an electronic device using the oscillator according to any one of the embodiments of the invention will be described.

Figure 11:
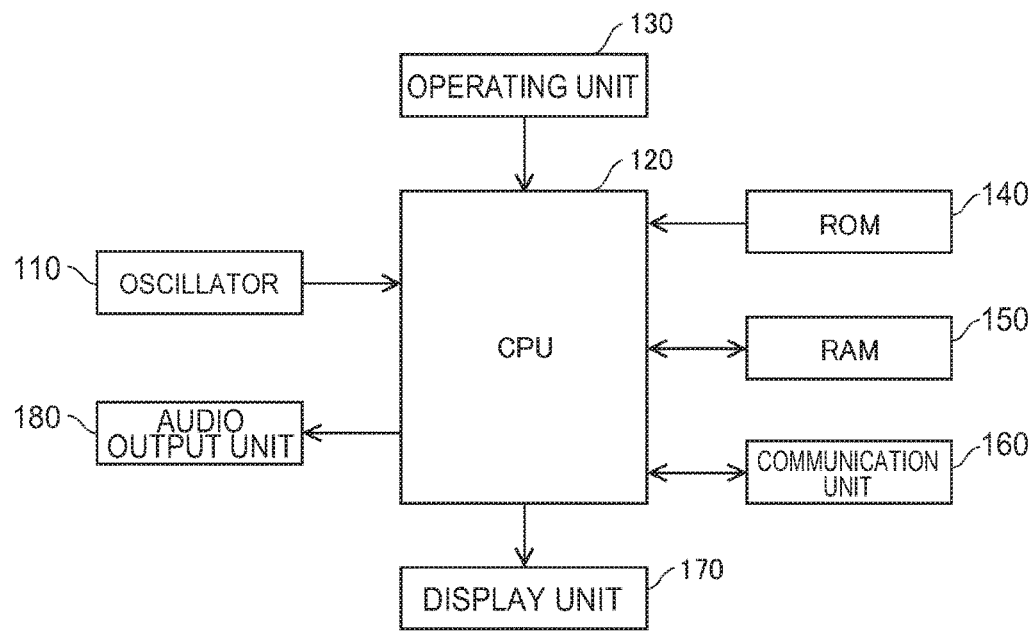
FIG. 11 is a block diagram illustrating a first configurational example of an electronic device according to an embodiment of the invention.

FIG. 11 is a block diagram illustrating a first configurational example of an electronic device according to an embodiment of the invention. The electronic device includes an oscillator 110 according to any one of the embodiments of the invention, a CPU 120, an operating unit 130, a ROM (read-only memory) 140, a RAM (random access memory) 150, a communication unit 160, a display unit 170, and an audio output unit 180. Note that apart of the components illustrated in FIG. 11 may be omitted or changed, or another component may be added to the components illustrated in FIG. 11.

The oscillator 110 performs an oscillation operation at a temperature compensated oscillation frequency, thereby, generating a clock signal. The clock signal, which is generated by the oscillator 110, is supplied to each member of the electronic device via the CPU 120 or the like.

The CPU 120 is synchronized with the clock signal that is supplied from the oscillator 110 so as to operate, and performs various signal processes or control processes according to a program stored in the ROM 140 or the like. For example, the CPU 120 performs various signal processes in response to an operational signal that is supplied from the operating unit 130, or controls the communication unit 160 such that data communication with an external device is performed. Otherwise, the CPU 120 generates an image signal for displaying various images on the display unit 170, and generates an audio signal for causing the audio output unit 180 to output various types of audio sounds.

The operating unit 130 is an input device including, for example, an operation key, a button switch, or the like, and outputs, to the CPU 120, an operating signal in response to an operation by a user. The ROM 140 stores a program, data, or the like, with which the CPU 120 performs various signal processes or control processes. In addition, the RAM 150 is used as a workspace of the CPU 120, and temporarily stores a program or data read from the ROM 140, data input using the operating unit 130, computational results executed by the CPU 120 using the program, or the like.

The communication unit 160 is configured of, for example, an analog circuit and a digital circuit and performs data communication between the CPU 120 and an external device. The display unit 170 includes, for example, a liquid crystal display (LCD) or the like, and displays various items of information in response to an image signal that is supplied from the CPU 120. In addition, the audio output unit 180 includes, for example, a speaker or the like, and outputs an audio sound based on an audio signal that is supplied from the CPU 120.

Examples of the electronic device described above, include, for example, a mobile terminal such as a mobile phone, a smart card, a calculator, an electronic dictionary, electronic game equipment, a digital still camera, a digital cinema, a television, a videophone, a security television monitor, a head mounted display, a personal computer, a printer, networking equipment, car navigation equipment, a measuring instrument, medical equipment (for example, an electronic thermometer, a sphygmomanometer, a blood glucose meter, an electrocardiograph, an ultrasonograph, and an electronic endoscope), and the like.

Figure 12:
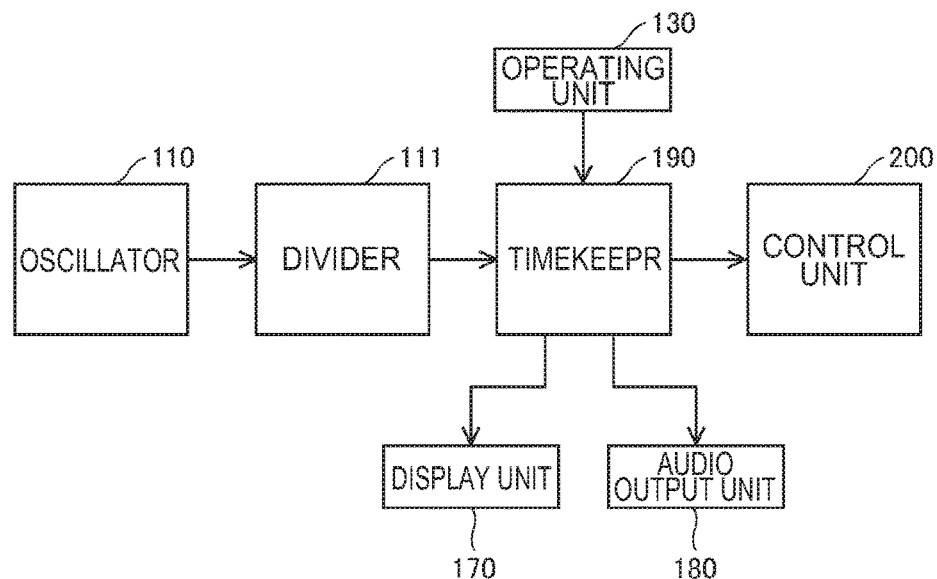
FIG. 12 is a block diagram illustrating a second configurational example of an electronic device according to another embodiment of the invention.

FIG. 12 is a block diagram illustrating a second configurational example of an electronic device according to another embodiment of the invention. In this example, a timepiece and a timer are described. The timepiece according to an embodiment of the invention includes the oscillator 110 according to any one of the embodiments of the invention, a divider 111, the operating unit 130, the display unit 170, the audio output unit 180, and a timekeeper 190. In addition, the timer according to an embodiment of the invention includes a control unit 200 instead of the audio output unit 180. Note that a part of the components illustrated in FIG. 12 may be omitted or changed, or another component may be added to the components illustrated in FIG. 12.

The divider 111 is configured of a plurality of flip-flops and divides a clock signal that is supplied from the oscillator 110 so as to generate a timekeeping divided clock signal. The timekeeper 190 is configured of a counter or the like, performs a timekeeping operation based on the divided clock signal that is supplied from the divider 111 so as to generate a display signal for displaying the current time or alarm time, or an alarm signal for generating an alarm sound.

The operating unit 130 is used to set the current time or the alarm time in the timekeeper 190. The display unit 170 displays the current time or the alarm time in response to the display signal that is supplied from the timekeeper 190. The audio output unit 180 generates an alarm sound in response to the alarm signal that is supplied from the timekeeper 190.

In the case of the timer, a timer function is provided instead of an alarm function. In other words, the timekeeper 190 generates a timer signal indicating that the current time matches the set time. The control unit 200 turns on and off a device that is connected to the timer in response to the timer signal which is supplied from the timekeeper 190.

According to the embodiment, it is possible to provide the electronic device that operates in response to an accurate clock signal which is generated by the oscillator 110 that reduces the change in the oscillation frequency due to the temperature dependence of the impedance or the like of the crystal resonator and has highly accurate frequency-temperature characteristics.

Moving Object

Next, a moving object using the oscillator according to any one of the embodiments of the invention will be described. Examples of the moving object include, for example, an automobile, a self-propelled robot, a self-propelled transport device, a train, a ship, an airplane, an artificial satellite, or the like.

Figure 13:
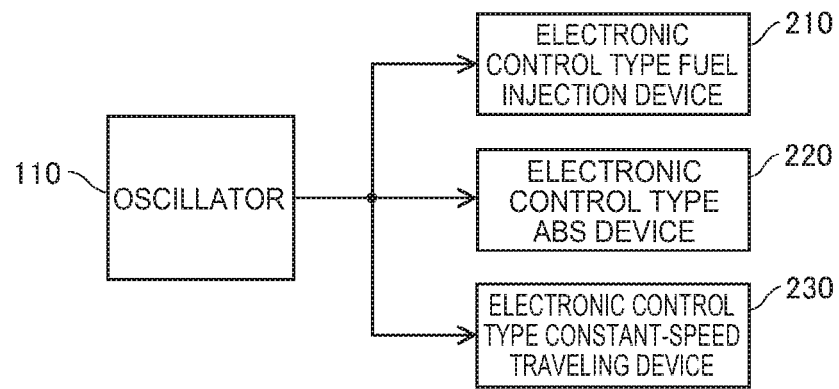
FIG. 13 is a block diagram illustrating a configurational example of a moving object according to an embodiment of the invention.

FIG. 13 is a block diagram illustrating a configurational example of a moving object according to an embodiment of the invention. As illustrated in FIG. 13, the moving object includes the oscillator 110 according to any one of the embodiments of the invention, and further includes various electronic control type systems such as an electronic control type fuel injection device 210, an electronic control type ABS device 220, or an electronic control type constant-speed traveling device 230. Note that a part of the components illustrated in FIG. 13 may be omitted or changed, or another component may be added to the components illustrated in FIG. 13.

The oscillator 110 performs an oscillation operation at a temperature compensated oscillation frequency, thereby, generating a clock signal. The clock signal, which is generated by the oscillator 110, is supplied to the electronic control type fuel injection device 210, the electronic control type ABS device 220, the electronic control type constant-speed traveling device 230, or the like.

The electronic control type fuel injection device 210 is synchronized with the clock signal that is supplied from the oscillator 110 so as to operate, and ejects a liquid fuel in a spray to an intake airflow at a predetermined timing in a premixed combustion engine such as a gasoline engine. The electronic control type ABS (anti-lock braking system) device 220 is synchronized with the clock signal that is supplied from the oscillator 110 so as to operate, gradually drives a brake in a powerful manner when an operation of braking is performed, and repeats releasing and driving of the brake when the moving object starts to move. The electronic control type constant-speed traveling device 230 is synchronized with the clock signal that is supplied from the oscillator 110 so as to operate, monitors the speed of the moving object, and controls an accelerator or the brake such that the moving object moves at a constant speed.

According to the embodiment, it is possible to provide the moving object that operates in response to an accurate clock signal which is generated by the oscillator 110 that reduces the change in the oscillation frequency due to the temperature dependence of the impedance or the like of the crystal resonator and has highly accurate frequency-temperature characteristics.

In the embodiments described above, the oscillator using the crystal resonator is described; however, the invention is not limited to the embodiments described above, and can be applied to an oscillator using a piezoelectric body other than a quartz crystal. In this manner, it is possible for those skilled in the related art to modify the invention in various manners within the technical idea of the invention.

The entire disclosure of Japanese Patent Application No. 2015-248274, filed Dec. 21, 2015 is expressly incorporated by reference herein.

What is claimed is:

1. An oscillator comprising:
    an oscillation stage circuit that is connected between a first electrode and a second electrode of a resonator and performs an oscillation operation;
    a variable capacitance element that is connected to the first or second electrode of the resonator and adjusts an oscillation frequency;
    a bandgap reference circuit that generates a reference voltage having magnitude that changes depending on temperature, the bandgap reference circuit having:
        a first current path to which a first resistor, a second resistor, and a first transistor or a first diode are connected in series; and
        a second current path to which a third resistor, a plurality of second transistors or a plurality of second diodes which are connected in parallel, respectively, and a fourth resistor are connected in series, the first or second current path having a current with a magnitude that changes depending on temperature, the reference voltage being generated at a connection point between the first resistor and the second resistor; and
    a bias current generating circuit that generates a bias current of the oscillation stage circuit based on the reference voltage, and thereby reduces a change in the oscillation frequency due to temperature dependence of impedance of the resonator or temperature dependence of sensitivity of the variable capacitance element.

2. The oscillator according to claim 1, wherein the bias current generating circuit includes a current adjusting resistor that has a temperature coefficient different from a temperature coefficient of one of the first, second, third, and fourth resistors, and generates the current based on the reference voltage and a resistance value of the current adjusting resistor.

3. The oscillator according to claim 2, wherein the current adjusting resistor has the temperature coefficient higher than the temperature coefficient of the one resistor.

4. The oscillator according to claim 1, wherein the bias current has temperature dependence lower than temperature dependence of the current flowing through the first or second current path.

5. An oscillator comprising:
    an oscillation stage circuit that is connected between a first electrode and a second electrode of a resonator and performs an oscillation operation;
    a variable capacitance element that is connected to the first or second electrode of the resonator and adjusts an oscillation frequency;
    a bandgap reference circuit that generates a reference voltage, the bandgap reference circuit having:
        a first current path to which a first resistor, a second resistor, and a first transistor or a first diode are connected in series; and
        a second current path to which a third resistor, a plurality of second transistors or a plurality of second diodes which are connected in parallel, respectively, and a fourth resistor are connected in series, the reference voltage being generated at a connection point between the first resistor and the second resistor; and
    a bias current generating circuit that includes a current adjusting resistor having a temperature coefficient different from a temperature coefficient of one of the first, second, third, and fourth resistors, the bias current generating circuit generating a bias current of the oscillation stage circuit based on the reference voltage and a resistance value of the current adjusting resistor, and thereby reducing a change in the oscillation frequency due to temperature dependence of impedance of the resonator or temperature dependence of sensitivity of the variable capacitance element.

6. The oscillator according to claim 5, wherein the current adjusting resistor has the temperature coefficient higher than the temperature coefficient of the one resistor.

7. The oscillator according to claim 5, wherein the bias current has temperature dependence lower than temperature dependence of a current flowing through one of the first current path and the second current path.

8. An oscillator comprising:
    an oscillation stage circuit that is connected between a first electrode and a second electrode of a resonator and performs an oscillation operation;
    a variable capacitance element that is connected to the first or second electrode of the resonator and adjusts an oscillation frequency;
    a bandgap reference circuit that generates a reference voltage, the bandgap reference circuit having:
        a first current path to which a first resistor, a second resistor, and a first transistor or a first diode are connected in series; and
        a second current path to which a third resistor, a plurality of second transistors or a plurality of second diodes which are connected in parallel, respectively, and a fourth resistor are connected in series, the reference voltage being generated at a connection point between the first resistor and the second resistor;
    a bias current generating circuit that generates a bias current of the oscillation stage circuit based on the reference voltage and a resistance value of a current adjusting resistor; and
    a setting circuit that sets a value of one of the first, second, third, and fourth resistors in response to data stored in a storage unit, or that generates a selection signal for selecting the current adjusting resistor from a plurality of resistors.

9. An electronic device comprising:
    the oscillator according to claim 1.

10. A moving object comprising:
    the oscillator according to claim 1.

* * * * *